United States Patent
Lin et al.

(10) Patent No.: US 9,245,773 B2
(45) Date of Patent: Jan. 26, 2016

(54) SEMICONDUCTOR DEVICE PACKAGING METHODS AND STRUCTURES THEREOF

(75) Inventors: Jing-Cheng Lin, Hsin-Chu (TW); Szu Wei Lu, Hsin-Chu (TW); I-Hsuan Peng, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 580 days.

(21) Appl. No.: 13/369,126

(22) Filed: Feb. 8, 2012

(65) Prior Publication Data

US 2013/0200529 A1  Aug. 8, 2013

(51) Int. Cl.
| | |
|---|---|
| *H01L 21/00* | (2006.01) |
| *H01L 21/66* | (2006.01) |
| *H01L 21/56* | (2006.01) |
| *H01L 23/00* | (2006.01) |
| *H01L 23/498* | (2006.01) |
| *H01L 23/538* | (2006.01) |
| *H01L 25/065* | (2006.01) |
| *H01L 25/00* | (2006.01) |
| *H01L 23/31* | (2006.01) |

(52) U.S. Cl.
CPC ........ *H01L 21/563* (2013.01); *H01L 23/49827* (2013.01); *H01L 23/5384* (2013.01); *H01L 24/94* (2013.01); *H01L 25/0655* (2013.01); *H01L 25/0657* (2013.01); *H01L 25/50* (2013.01); *H01L 23/3128* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/94* (2013.01); *H01L 2225/06513* (2013.01); *H01L 2225/06517* (2013.01); *H01L 2225/06541* (2013.01); *H01L 2924/181* (2013.01)

(58) Field of Classification Search
CPC ... H01L 2224/94; H01L 21/563; H01L 24/94; H01L 25/0655
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,117,695 A | 9/2000 | Murphy et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,400,036 B1 | 6/2002 | Tang et al. |
| 6,434,016 B2 | 8/2002 | Zeng et al. |

(Continued)

*Primary Examiner* — Mohsen Ahmadi
(74) *Attorney, Agent, or Firm* — Slater & Matsil, L.L.P.

(57) ABSTRACT

Semiconductor device packaging methods and structures thereof are disclosed. In one embodiment, a method of packaging semiconductor devices includes coupling a plurality of second dies to a top surface of a first die, and determining a distance between each of the plurality of second dies and the first die. The method also includes determining an amount of underfill material to dispose between the first die and each of the plurality of second dies based on the determined distance, and disposing the determined amount of the underfill material under each of the plurality of second dies.

20 Claims, 4 Drawing Sheets

(56) References Cited

U.S. PATENT DOCUMENTS

| | | |
|---|---|---|
| 6,448,661 B1 | 9/2002 | Kim et al. |
| 6,461,895 B1 | 10/2002 | Liang et al. |
| 6,498,054 B1 | 12/2002 | Chiu et al. |
| 6,562,653 B1 | 5/2003 | Ma et al. |
| 6,570,248 B1 | 5/2003 | Ahn et al. |
| 6,590,409 B1 | 7/2003 | Hsiung et al. |
| 6,600,222 B1 | 7/2003 | Levardo |
| 6,607,938 B2 | 8/2003 | Kwon et al. |
| 6,650,022 B1 | 11/2003 | Qi et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,151,014 B2 * | 12/2006 | Manepalli ............ H01L 21/563 257/E21.503 |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,327,448 B2 | 2/2008 | Klein et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,622,311 B1 * | 11/2009 | Cha et al. .................... 438/16 |
| 7,790,499 B2 | 9/2010 | Sato et al. |
| 7,834,450 B2 | 11/2010 | Kang |
| 8,269,979 B2 | 9/2012 | Klein et al. |
| 8,518,722 B2 | 8/2013 | Chen et al. |
| 9,068,067 B2 * | 6/2015 | Xu ..................... C08L 23/0884 |
| 2002/0028533 A1 | 3/2002 | Tang et al. |
| 2002/0167079 A1 * | 11/2002 | Pu et al. ..................... 257/685 |
| 2006/0021438 A1 | 2/2006 | Klein et al. |
| 2006/0134901 A1 * | 6/2006 | Chaware et al. ............. 438/612 |
| 2007/0069041 A1 | 3/2007 | Quinones et al. |
| 2008/0194047 A1 | 8/2008 | Sato et al. |
| 2010/0055848 A1 | 3/2010 | Cha et al. |
| 2012/0052603 A1 | 3/2012 | Chen et al. |
| 2012/0119354 A1 | 5/2012 | Tsai et al. |
| 2012/0193779 A1 * | 8/2012 | Lee et al. ..................... 257/737 |
| 2013/0093084 A1 * | 4/2013 | Chen et al. ............ H01L 21/563 257/738 |
| 2013/0200529 A1 | 8/2013 | Lin et al. |
| 2013/0244346 A1 | 9/2013 | Wang et al. |
| 2013/0344627 A1 | 12/2013 | Kim et al. |

* cited by examiner

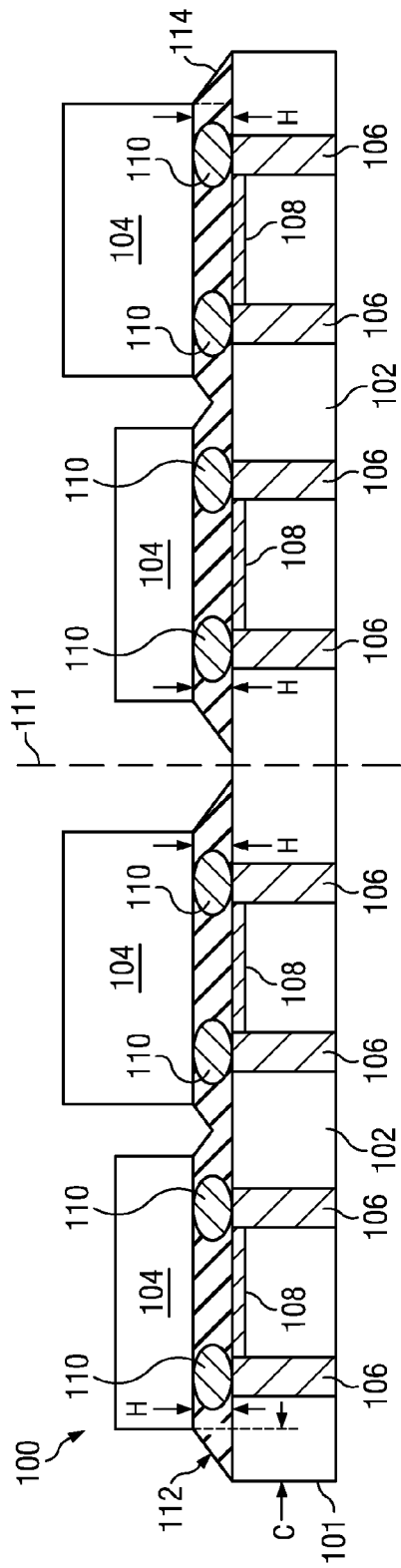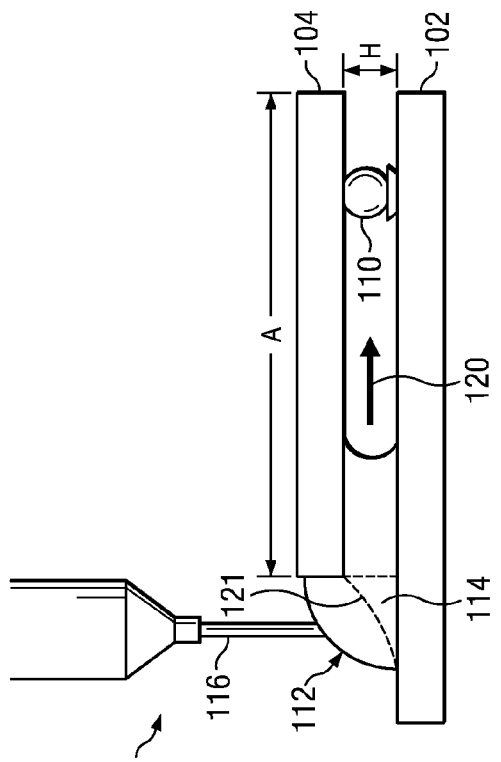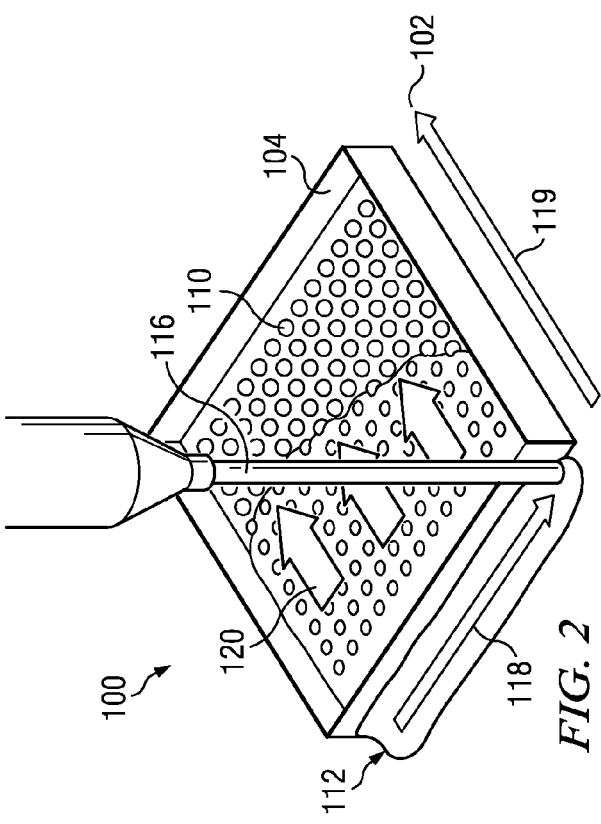

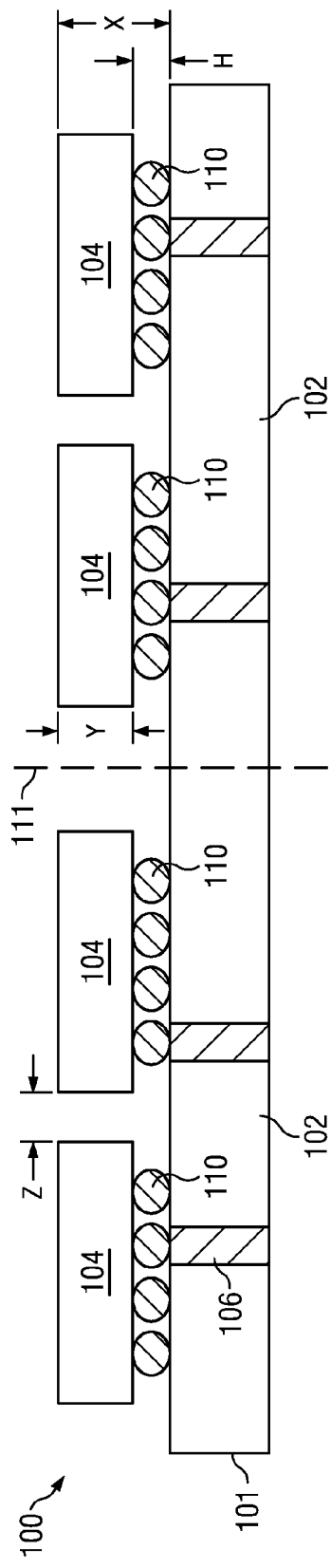
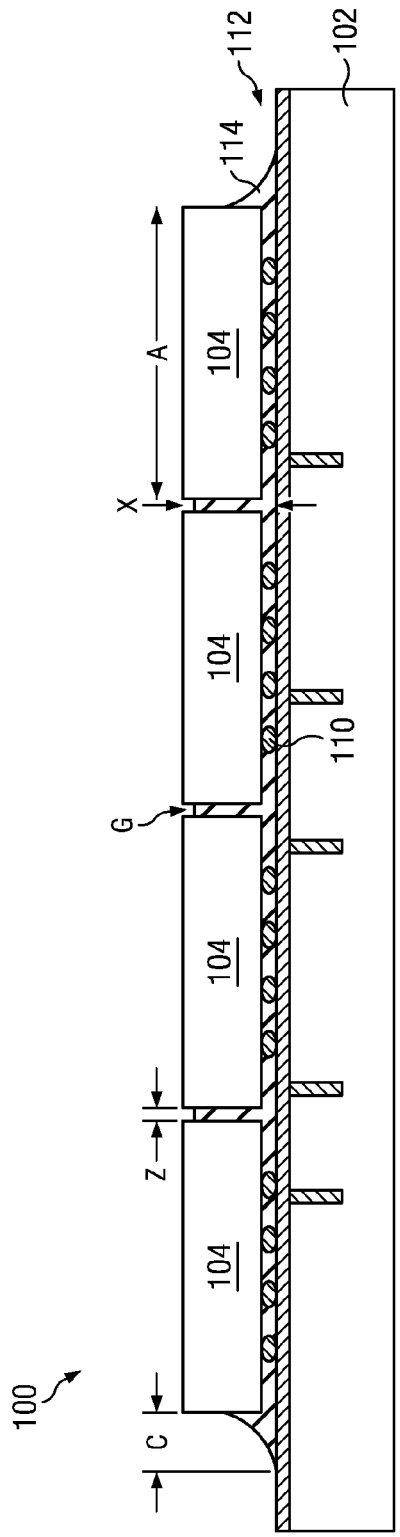

SEMICONDUCTOR DEVICE PACKAGING METHODS AND STRUCTURES THEREOF

CROSS-REFERENCE TO RELATED APPLICATIONS

This application relates to the following co-pending and commonly assigned U.S. patent application Ser. No. 13/224,575, filed on Sep. 2, 2011, entitled, "Method of Three Dimensional Integrated Circuit Assembly," which application is hereby incorporated herein by reference.

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, packages such as wafer level packaging (WLP) have begun to be developed, in which integrated circuits (ICs) are placed on a carrier having wiring for making connection to the ICs and other electrical components. To further increase circuit density, three-dimensional (3D) ICs have also been developed, in which two or more dies or ICs are bonded together and electrical connections are formed between the dies and contact pads on a substrate.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 is a cross-sectional view of dies of a first group coupled to dies of a second group in accordance with an embodiment of the present disclosure;

FIGS. 2 and 3 are a perspective view and a cross-sectional view, respectively, of an underfill material being applied under a die of the second group in accordance with an embodiment;

FIG. 4 is a cross-sectional view of dies of the first group coupled to dies of the second group before the underfill material is applied, illustrating measurements and dimensions in accordance with an embodiment;

FIG. 5 is a cross-sectional view of four dies of the second group coupled to a die of the first group in accordance with another embodiment after the underfill material is applied;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 6:
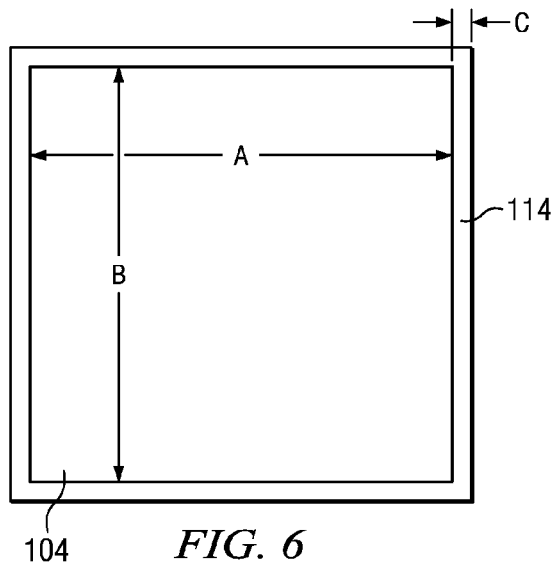
FIG. 6 shows a top view of a die of the second group in accordance with an embodiment.

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the packaging of semiconductor devices. Novel methods of packaging semiconductor devices, structures thereof, and metrology methods for packaging semiconductor devices will be described herein.

Referring first to an embodiment shown in FIG. 1, a semiconductor device 100 packaged using a 3DIC process is shown wherein an amount of underfill material 112 is determined using a method to be described herein. The semiconductor device 100 includes a workpiece 101 comprising a first group of dies 102. The first group of dies 102 is also referred to herein as first dies 102 and a plurality of first dies 102. A second group of dies 104 is coupled to dies 102 of the first group in a 3DIC packaging configuration in accordance with some embodiments. The second group of dies 104 is also referred to herein as second dies 104, a plurality of second dies 104, and top dies 104. Some embodiments of the present disclosure include methods of determining an amount of an underfill material 112 to dispose under each die 104 of the second group coupled to the dies 102 of the first group, to be described further herein. The methods determine an optimum amount of the underfill material 112 to dispense for each die 104 of the second group such that a good fillet 114 formation is achieved for the underfill material 112, voids do not form in the underfill material 112 under the dies 104, and bridging of the underfill material 112 between closely-spaced dies 104 is avoided.

The workpiece 101 comprises a first group of dies and an interposer or a substrate with a plurality of through-substrate vias (TSVs) 106 formed therein, in some embodiments. Only two of the first group of dies 102 are shown on the workpiece 101; however, dozens or hundreds of dies 102 of the first group may be formed across the workpiece 101. A redistribution layer (RDL) 108 is disposed proximate a top surface of the dies 102. Bumps 110 are coupled between the first group of dies 102 and the second group of dies 104. The bumps 110 are disposed over portions of the RDL 108 of the dies 102, for example. The bumps 110 comprise solder and provide electrical and mechanical connection for the second group of dies 104 to the first group of dies 102. The dies 102 are formed on the workpiece 101 and are separated after the 3DIC packaging process at singulation lines 111 in some embodiments. The first group of dies 102 and the second group of dies 104 may comprise semiconductor dies comprising integrated circuits, for example.

Dies 104 in the second group of dies are also referred to as top dies. The second group of dies 104 is spaced apart from the first group of dies 102 by a distance H. The height of the bumps 110 may vary for each die 104, for example, so that distance H is different for each die 104. The fillets 114 of the underfill material 112 extend outwardly from beneath the dies 104 of the second group and comprise a width C proximate a perimeter of the dies 104 along the edges of the dies 104.

In accordance with some embodiments of the present disclosure, after the second group of dies 104 is attached to the first group of dies 102, the distance H is determined or measured for each die 104. Further, an amount of underfill material 112 to dispense for each die 104 is determined, based on the measured distance H for each die 104. In particular, a volume V of underfill material 112 is calculated for each die 104 using Equation 1:

$$V = V_1 + V_2;$$

wherein $V_1$ is a calculated volume of the underfill material 112 under each die 104, and wherein $V_2$ is a calculated volume of the fillet 114 of the underfill material 112 proximate a perimeter of each die 104, to be described further herein.

FIG. 2 is a perspective view of the underfill material 112 being applied to a semiconductor device 100 under a die 104 in accordance with an embodiment. The underfill material 112 is applied using a dispensing needle 116 along one side of the die 104, as shown by arrow 118, or along two adjacent sides of the die 104 in an L-shape, as shown by arrows 118 and 119, which show the movement of the dispensing needle 116 during the dispensing process of the underfill material 112. The underfill material 112 may be applied in a single pass or multiple passes of the dispensing needle 116. The dispensing needle 116 comprises a diameter of about 1 to 2 mm, for example. The underfill material 112 flows in the direction indicated by arrow 120 under the die 104.

FIG. 3 is a cross-sectional view of the underfill material 112 being applied under a die 104. The underfill material 112 is a liquid when applied that flows beneath the die 104, between the bumps 110 along a width A of the die 104. The fillets 114 of the underfill material 112 may have a convex shape during the application process due to a bead of the underfill material 112 liquid being dispensed from the needle 116. The liquid underfill material 112 flows in the direction indicated by arrow 120 in FIG. 3 under the die 104 due to capillary action, for example. The underfill material 112 comprises an epoxy or a polymer in some embodiments, although other materials may alternatively be used. The underfill material 112 becomes solid or hardened after being cured, e.g., after the workpiece 101 is heated in an oven to evaporate fluid in the underfill material 112. After the underfill material 112 is applied, the fillets 114 of the underfill material 112 are formed along the edges of the die 104 due to a meniscus effect of the liquid underfill material 112 during and after the dispensing and curing processes of the underfill material 112. The fillets 114 may have a concave shape on a top surface thereof after curing, for example, as shown by the dashed curved line 121 in FIG. 3.

FIG. 4 shows a cross-sectional view of a plurality of dies 104 of the second group coupled to a plurality of dies 102 of the first group on a workpiece 101 in accordance with an embodiment, before the underfill material 112 is applied. FIG. 4 illustrates some dimensions that are used to determine an amount of underfill material 112 for each of the dies 104. Each die 104 has a thickness Y. The thicknesses Y of the dies 104 may be the same or different for the second group of dies 104, depending on the application. The thickness Y may be measured for each of the dies 104 and/or the thickness Y may be obtained from a data sheet for each of the dies 104, for example.

Dimension X comprises a height of a top surface of each of the dies 104 from a top surface of the dies 102. Dimension X is also referred to herein as a "stand-off height". The stand-off height X is a measurable dimension that is used to determine the dimension H between the top surfaces of the dies 104 and the top surfaces of dies 102 in accordance with some embodiments, wherein H=X−Y. Dimension H is about 20 to 40 μm in some embodiments, for example, although alternatively, dimension H may have other values. Determining the distance H between each of the dies 104 of the second group and dies 102 of the first group comprises measuring the stand-off height X between the top surfaces of the dies 104 of the second group and a top surface of dies 102 of the first group, and subtracting the thickness Y of each of the dies 104 in some embodiments, for example.

The first group of dies 102 comprises interposers for packaging a plurality of the second group of dies 104 in some embodiments. Alternatively, the first group of dies 102 comprise integrated circuits that include the TSVs 106, in other embodiments. A dozen or hundreds of dies 102 may be included on a single workpiece 101, for example. The dies 104 of the second group are spaced apart from other dies 104 of the second group by a die-to-die dimension Z which may be about 10 to 400 μm in some embodiments, for example, although alternatively, dimension Z may have other values. Dimension Z may be measured between closely-spaced dies 104 of the second group disposed over each die 102 of the first group, in accordance with some embodiments of the present disclosure.

In FIGS. 1 and 4, two dies 104 of the second group are shown attached to a top surface of a die 102 of the first group. Alternatively, in some embodiments, three or more dies 104 of the second group are attached to a top surface of a die 102 of the first group. As illustratively shown in FIG. 5 in a cross-sectional view, four dies 104 of the second group are attached to a top surface of a die 102 of the first group.

FIG. 6 shows a top view of one die 104 of the second group of dies 104. The die 104 includes a width A and a length B. The width A and the length B are measured for each of the second group of dies 104 in some embodiments. The width A and the length B are obtained from a data sheet for each of the dies 104 in other embodiments. Each of the width A and the length B of the dies 104 is about 7 to 30 mm in some embodiments, but may have other values in some other embodiments.

The fillet 114 has a width C, which is determined based on wafer warpage such as the warpage of the workpiece 101. In some embodiments, the smaller the warpage, the smaller width C will be. The width C of fillet 114 is about 100 to 300 μm in some embodiments. The width C is about 50 to 300 μm in some other embodiments. Alternatively, the fillet 114 width C may comprise other values. The height H of the fillet 114 may comprise dimension H in some embodiments after curing, as shown in FIGS. 1 and 3. Alternatively, the height H of the fillet 113 may be greater than dimension H, as shown in FIG. 5.

Referring again to FIGS. 4 and 5, the die-to-die dimensions Z between the top dies 104 are also measured as part of the metrology of the present disclosure in some embodiments. The die-to-die dimensions Z are defined and determined by the layout of the semiconductor device 100. After attaching the dies 104 to the dies 102 of the workpiece 101, the die-to-die dimensions Z are measured by metrology. The measured die-to-die dimensions Z are used to calculate a volume and/or mass of underfill material 112 to achieve the desired width C (see FIG. 6) of the fillet 114, for example. Thus, the width C of the fillet 114 is controlled using the metrology methods of embodiments of the present disclosure. The die-to-die dimensions Z are about 10 to 40 μm in some embodiments, for example, although alternatively, the die-to-die dimensions Z may be other values.

The bumps 110 in FIG. 4 between the dies 102 and dies 104 comprise a bump density D that may be the same or different for the dies 104, for example. The bump density D is determined by evaluating the number of bumps 110, the size of the bumps 110, and the surface area (A×B) of the dies 104 of the second group in some embodiments, for example. The bump density D is about 5 to 20% in some embodiments, for example, although alternatively, the bump density D may comprise other values. The bump density D is determined using the bump 110 diameter and the number of bumps 110 within a particular surface area (A×B) in other embodiments, for example.

Referring again to FIG. 4, after the dies 104 are attached to the dies 102, the stand-off height X of each of the dies 104 is measured from dies 102, and a volume of the underfill material 112 is calculated for each of the dies 104 based on the measured stand-off height X. Calculating the volume V of the underfill material 112 for each of the dies 104 comprises using Equation 1 above and the following Equation 2 and Equation 3:

$$V_1 = [A \times B \times H \times (1-D)]; \qquad \text{(Equation 2)}$$

$$V_2 = \{[C^2 - (\pi \times C^2)/4] \times 2(A+B)\} \qquad \text{(Equation 3)}$$

wherein A is a width of a die 104 in the second group, B is a length of a die 104 in the second group, C is a width of a fillet 114 of underfill material 112 proximate a perimeter of a die 104 in the second group, D is a bump density of a die 104 in the second group, and H is the distance determined between the die 104 in the second group and a die 102 in the first group, such as X-Y in FIG. 4. The calculated volume V comprises a volume of the underfill material 112 before curing, for example.

The volume of the underfill material 112 is calculated after curing in other embodiments, as another example. In these embodiments a shrinkage rate E for the underfill material 112 is also considered in calculating the amount of underfill material 112 to dispense for each die 104 of the second group. For example, the shrinkage rate E after curing the underfill material 112 is determined, and a shrinkage volume SV is calculated using the shrinkage rate E. The shrinkage volume SV is calculated in some embodiments using Equation 4:

$$SV = V \times E$$

wherein V is the volume calculated using Equations 1, 2, and 3. The shrinkage rate E may vary depending on the material characteristics of the type of underfill material 112 used, for example. The shrinkage rate E is about 1 to 2% in some embodiments, for example, although alternatively, the shrinkage rate E may have other values. The calculated shrinkage volume SV is then dispensed under each of the dies 104 in the second group.

In some other embodiments, determining the amount of underfill material 112 to dispose between the dies 102 in the first group and each of the dies 104 in the second group comprises using Equation 5:

$$SV = ([A \times B \times H \times (1-D)] + \{[C^2 - (\pi \times C^2)/4] \times 2(A+B)\}) \times E;$$

wherein A is a width of a die 104 in the second group, B is a length of the die 104 in the second group, C is a desired width of a fillet 114 of underfill material 112 proximate a perimeter of the die 104 in the second group, D is a bump density of a die 104 in the second group, E is a shrinkage rate of the underfill material 112, and H is the distance determined between the die 104 in the second group and a die 102 in the first group, for example.

Equations 1 through 5 are used to determine the volume of the underfill material 112 for various embodiments wherein the die-to-die dimension Z>(2×C) in some embodiments; i.e., wherein the dies 104 in the second group are spaced apart far enough so that the die-to-die dimension Z is greater than two widths C. In other embodiments, if the dies 104 in the second group are spaced apart by greater than a single width C but less than two widths C (2×C>Z>C), then two adjacent fillets 114 will bridge. The overlap inaccuracy, however, may be neglected because it is very small. If the dies 104 in the second group are spaced apart by less than a single width C (Z<C), then the die-to-die dimension Z rather than the width C is used to calculate the volume of the underfill material 112 to dispense, in other embodiments.

For example, in FIG. 5, if a group of closely-spaced dies 104 in the second group are spaced apart by less than a single width C (Z<C), then the number of dies 104 in the second group and the number of gaps G between the dies 104 in the second group is included in the equation for the volume in some embodiments. Under these conditions of closely-spaced dies 104 in the second group, in some embodiments, the following Equation 6 is used to calculate the volume V of underfill material 112 to dispense for the closely-spaced dies 104 in the second group:

$$V = V_1 + V_2 + V_G$$

wherein $V_1$ is a calculated volume of the underfill material 112 under all of the dies 104 in the second group, $V_2$ is a calculated volume of the fillet 114 of the underfill material 112 proximate a perimeter of the edge of the dies 104 in the second group, and $V_G$ is the volume of the underfill material 112 to be dispensed between the closely-spaced dies 104 in the second group in the gaps G. The volume of the underfill material 112 for the gaps G is calculated using the following Equation 7 in some embodiments:

$$V_G = Z \times A \times X \times N;$$

wherein the variables Z, A, and X are the factors and dimensions described previously. For example, Z is the die-to-die dimension between the dies 104 of the second group; A is a width of a die 104 in the second group; X is a stand-off height of the dies 104 in the second group; and N is the number of gaps G between the dies 104 in the second group. The number of gaps G=3 in the example shown in FIG. 5. Equation 2 is used to calculate the volume $V_1$ of underfill material 112 to dispense beneath each die 104 in the second group, in some embodiments.

Equation 3 is used to calculate the volume $V_2$ of underfill material 112 for the fillet 114 that will be formed on the edge dies 104 in some embodiments. For example, if four dies 104 in the second group that are substantially square (i.e., A=B, see FIG. 6) are disposed over a die 102 in the first group in a row as shown in FIG. 5, then ¾ of $V_2$ in Equation 3 is the fillet 114 volume for the end dies 104 because the fillet 114 is formed on three of the four edges for the end dies 104. Similarly, ½ $V_2$ of Equation 3 is the fillet 114 volume for the central dies 104 because the fillet 114 is formed on two of the four edges of the central dies 104, for example. The underfill material 112 is dispensed along the group of four dies 104 shown in FIG. 5 simultaneously in a single pass or multiple passes of the dispensing needle 116 along one side or along two or more sides of the group of four dies 104 of the second group, in this embodiment.

Figure 7A:
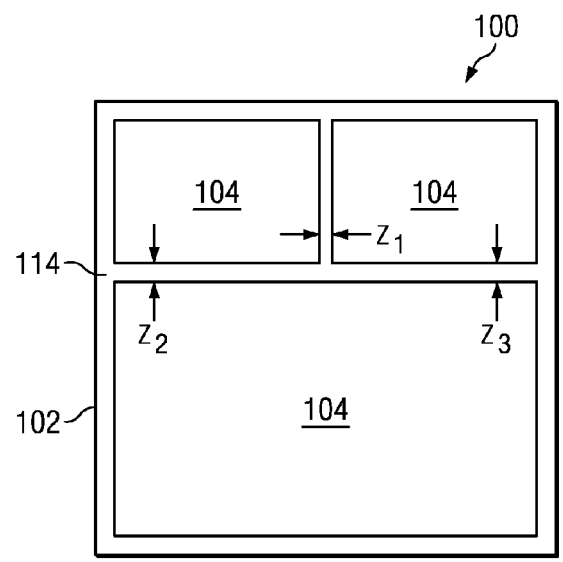
FIGS. 7A and 7B are top views of a plurality of dies of the second group attached to a die of the first group in accordance with an embodiment.
Figure 7B:
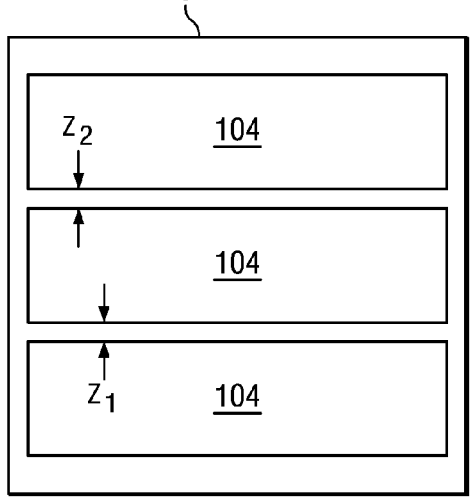

FIG. 7A is a top view of three dies 104 of the second group attached to a die 102 of the first group in accordance with an embodiment. Two or more dies 104 of the second group are packaged on a single die 102 of the first group are within the scope of various embodiments of the present disclosure. Some dies 104 may comprise central processing units (CPU) and other dies 104 may comprise memory devices such as dynamic random access memory (DRAM) devices, as an example. Alternatively, the dies 104 of the second group and the die 102 of the first group may comprise other types of devices, depending on the application. The dies 104 may be spaced apart by die-to-die dimensions $Z_1$, $Z_2$, and $Z_3$, for example. A fillet 114 of the underfill material 112 resides between the dies 104 and proximate edges of the perimeter of the second group of dies 104. FIG. 7B illustrates an embodiment wherein three of the dies 104 of the second group are arranged in a row in a top view, for example.

Figure 8:
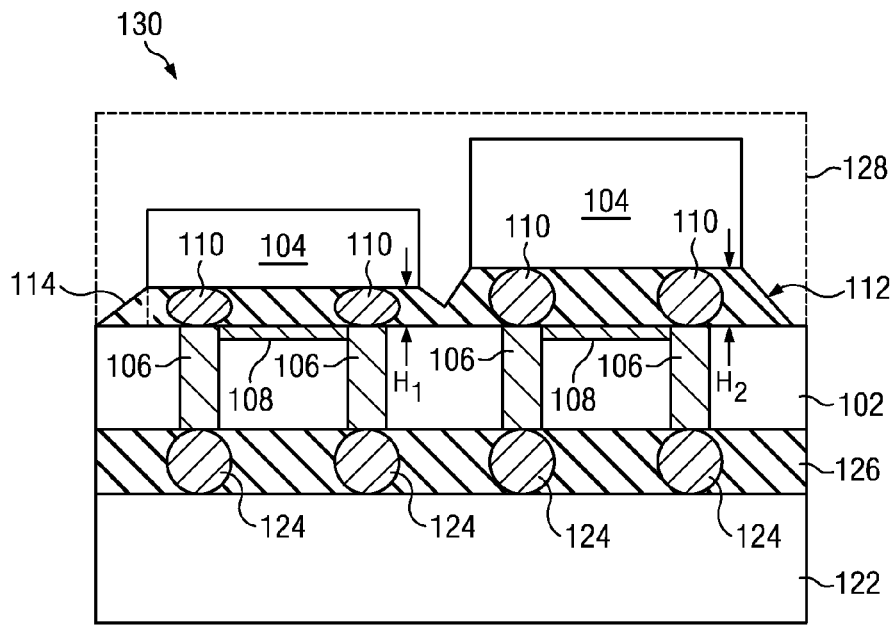
FIG. 8 is a cross-sectional view of a packaged semiconductor device in accordance with an embodiment that includes a plurality of dies of the second group coupled to a die of the first group, wherein an amount of underfill material for the plurality of dies of the second group is determined using a method described herein.

FIG. 8 is a cross-sectional view of a packaged semiconductor device 130 including dies 104 of the second group coupled to a die 102 of the first group in accordance with an embodiment after the completion of the packaging process and singulation of the dies 102. The optimal amount of underfill material 112 is determined using the methods described herein. The die 102 may be coupled to a substrate 122 by a plurality of bumps 124. An underfill material 126 comprising a second underfill material may be disposed between the die 102 and the substrate 122, as described in U.S. patent application Ser. No. 13/224,575 which is incorporated herein by reference. The underfill material 126 may comprise a similar material as underfill material 112. The underfill material 126 may be applied using a similar method described for underfill material 112, for example. The substrate 122 is coupled to the bottom surface of the die 102 of the first group. In some embodiments, a molding compound 128 may be formed over the dies 104 of the first group and the underfill material 112, as shown in dashed lines 128 in FIG. 8. The molding compound 128 may be disposed over exposed portions of the die 102 of the first group, over the fillets 114 of the underfill material 112, and over the dies 104 of the second group, as shown.

FIG. 8 illustrates that the distances $H_1$ and $H_2$ between the dies 104 of the second group and the die 102 of the first group vary for each of the dies 104 of the second group in accordance with some embodiments. In accordance with various embodiments of the present disclosure, a greater volume of underfill material 112 is dispensed under dies 104 having a greater distance $H_1$ or $H_2$. In the embodiment shown, distance $H_1$ is less than distance $H_2$, and a first volume of the underfill material 112 for the die 104 spaced apart by distance $H_1$ a is less than a second volume of the underfill material 112 for the die 104 spaced apart by distance $H_2$, for example.

Additional dies 104 from the second group (not shown in FIG. 8; see FIG. 5) may also be coupled to the top surface of the die 102 of the first group, and the underfill material 112 may also be disposed between the die 102 from the first group and the additional dies 104 from the second group. The volume of the underfill material 112 beneath the dies 104 of the second group varies as a function of the distances $H_1$ and $H_2$ between the dies 102 of the first group and the dies 104 of the second group in some embodiments, for example.

Figure 9:
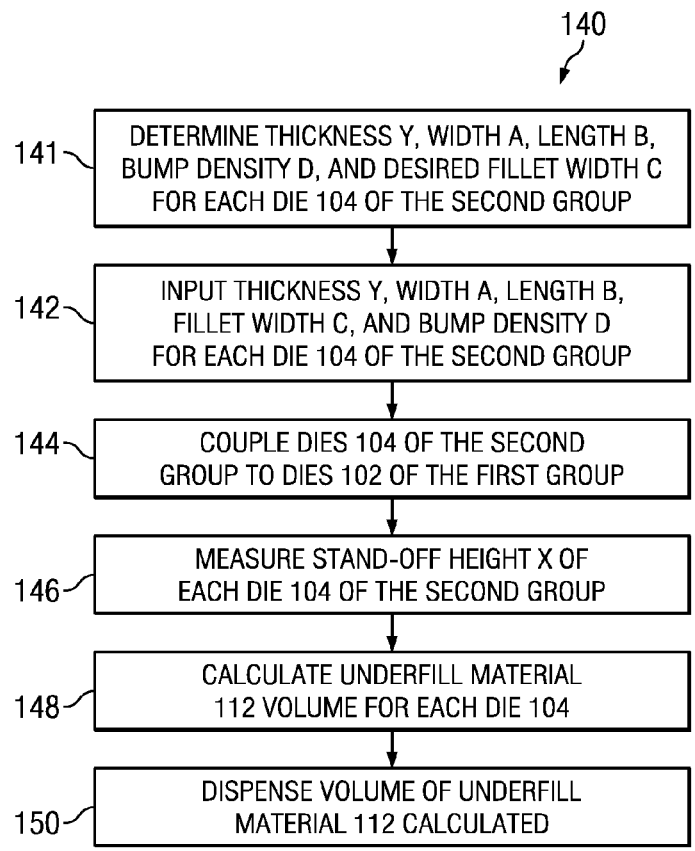
FIG. 9 is a flow chart illustrating a method of packaging semiconductor devices in accordance with an embodiment.

FIG. 9 is a flow chart 140 illustrating a method of packaging semiconductor devices 102 and 104 in accordance with an embodiment of the present disclosure. In step 141, thicknesses Y, widths A, lengths B, bump densities D, and a desired fillet 114 width C for each of the dies 104 of the second group is determined. In step 142, the values of these variables are input, e.g., into a computer, in a spreadsheet, program, or other tool, that will be used to calculate the volume amount of underfill material 112 for each die 104 of the second group. In step 144, the dies 104 of the second group are coupled to dies 102 of the first group. In step 146, the stand-off height X of each die 104 in the second group is measured. The measured stand-off height X values are also input, e.g., into the spreadsheet or program for calculating the underfill material 112 volume. In step 148, the volume for underfill material 112 is then calculated for each die 104 in the second group, using Equations 1, 2, 3, 4, 5, 6, and/or 7 described herein. In step 150, the calculated amount of underfill material 112 is then dispensed under each die 104 in the second group. As a result, the underfill material 112 is formed beneath each die 104 in the second group above the dies 102 in the first group. Fillets 114 of the underfill material 112 are formed proximate the edges in perimeter regions of the dies 104 of the second group. The underfill material 112 may also be formed between closely-spaced dies 104 of the second group as described for FIG. 5.

Thus, in accordance with some embodiments, a first metrology process is used to determine and/or measure the thickness Y, stand-off height X, die-to-die gap Z, die size A and B, and bump density D of a top die 104 of the second group. The measurements from the first metrology process are used to determine a total volume V or shrinkage volume SV for each top die 104 of the second group. The underfill material 112 is dispensed based on the first metrology process feedback, and each top die 104 in the second group has a single calculated volume for dispensing the underfill material 112. In some embodiments, after the underfill material 112 is dispensed and cured, a second metrology process is performed comprising a camera check. The camera check may be performed using a still camera or other devices, for example. The image captured by the camera or other device may be measured to determine the width C of the fillet 114 and height, to monitor or determine whether too much or too little underfill material 112 has been applied for each top die 104 of the second group. In addition, a third metrology process may also be used in some embodiments. The third metrology process comprises a final check using an ultrasonic testing apparatus. The third metrology process checks for voids beneath the top dies 104 of the second group in some embodiments, for example.

The amount or volume of underfill material 112 for each die 104 of the second group is programmed into a computer of a dispensing machine that includes the dispensing needle 116, increasing the through-put of packaging the semiconductor devices 100, in some embodiments.

In some embodiments, an initial calculation of the volume V or the shrinkage volume SV is made, and a test run or pilot run is performed on one or more workpieces 101. The width C of the fillet 114 and height H are measured for each of the top dies 104 of the second group. The volume V and/or shrinkage volume SV calculations are adjusted, e.g., are increased or decreased for each of the top dies 104, to determine a volume calculation to be used for dispensing for a main wafer run to package semiconductor devices, for example. The fillet 114 width C comprises an iterative calculation in some embodiments, e.g., in a metrology feed-forward system. After a first die run or pilot run using a first predetermined desired width C of the fillet 114, the dispensing amount of the underfill material 112 is modified and adjusted, based on measurements taken, as described herein. Additional pilot runs are repeated in some embodiments, and the metrology data is fed-back to subsequent pilot or manufacturing runs, for example.

The equations 1 through 7 described herein are used to calculate volumes of the underfill material 112 to dispense. The weight of the underfill material 112 to dispense is also determined based on the calculated volumes in some embodiments, using the equations described herein and the density of the underfill material 112, wherein the weight or mass M of the underfill material 112 is equal to the volume V times the density of the underfill material 112 $D_{UM}$ (M=V×$D_{UM}$.) The shrinkage volume SV is alternatively used to calculate the weight or mass M of the underfill material 112 to be dispensed for each die 104 of the second group, in other embodiments.

The volume V or shrinkage volume SV of the underfill material 112 for a single top die 104 calculated may be a mass of about 80 to 300 mg of the underfill material 112, as an example. Alternatively, the mass of the underfill material 112 dispensed may be other values, depending on the sizes and numbers of the top dies 104 and the other factors and variables described herein.

In accordance with some embodiments of the present disclosure, the measured stand-off heights X may vary for the dies 104 of the second group across the surface of a workpiece 101. Thus, the calculation data for the underfill material 112 volumes SV for each of the dies 104 also varies across the surface of the workpiece 101.

Embodiments of the present disclosure include methods of packaging semiconductor devices and structures thereof. Embodiments also include methods of determining an amount of underfill material 112 to dispose between dies 102 of a first group and dies 104 of a second group of a 3DIC. Embodiments further include semiconductor devices and packaged semiconductor devices 130 that have been packaged using the methods described herein.

Some embodiments of the disclosure include one or a combination of the following features and/or advantages. In some packaging techniques and metrology processes, an appropriate amount of underfill material 112 is applied for each top die 104 and/or and groups of top dies 104 of a 3DIC. An optimum amount of underfill material 112 is determined to dispense for each die 104 of a second group such that a good fillet 114 formation is achieved for each die 104. Advantageously, the optimum amount of underfill material 112 determined for each die 104 results in the prevention of or a reduction in void formation in the underfill material 112 under the dies 104. The determined optimum amount of underfill material 112 also results in the prevention of or a reduction in bridging of the underfill material 112 between closely-spaced top dies 104 of the second group, which further results in a reduction in stress of the packaged semiconductor devices 130 and increased yields.

Variations in top die 104 size and bump 110 height differences are accommodated for in the determination of the underfill material 112 volume, resulting in accurate volume calculations and improved fillet 114 profiles, widths C, and heights. In some embodiments, the methods described herein result in reduced warpage and void issues of the packaged semiconductor devices 130, e.g., after curing. In some embodiments, the methods described herein provide well-controlled metrologies and measurements of stand-off height and die sizes for accurate underfill material volume calculations, resulting in improved process windows. The methods of determining amounts of underfill material 112 for 3DICs described herein are easily implemented in packaging process flows.

In accordance with one embodiment of the present disclosure, a method of packaging semiconductor devices includes coupling a plurality of second dies to a top surface of a first die, and determining a distance between each of the plurality of second dies and the first die. The method includes determining an amount of underfill material to dispose between the first die and each of the plurality of second dies based on the determined distance, and disposing the determined amount of the underfill material under each of the plurality of second dies.

In accordance with another embodiment, a method of determining an amount of underfill material to dispose between a first die and a plurality of second dies of a 3DIC is disclosed. The method includes coupling a plurality of second dies to a plurality of first dies of a workpiece. A stand-off height of each of the plurality of second dies from the plurality of first dies is measured. The method includes calculating a volume of an underfill material for each of the plurality of second dies based on the measured stand-off height.

In accordance with yet another embodiment, a semiconductor device includes a first die, a second die coupled to a top surface of the first die, and a third die coupled to the top surface of the first die. An underfill material is disposed between the first die and the second die and between the first die and the third die. A first volume of the underfill material for the second die is different than a second volume of the underfill material for the third die.

Although embodiments of the present disclosure and their advantages have been described in detail, it should be understood that various changes, substitutions and alterations can be made herein without departing from the spirit and scope of the disclosure as defined by the appended claims. For example, it will be readily understood by those of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging semiconductor devices, the method comprising:
   coupling a plurality of second dies to a top surface of a first die;
   determining a distance between a second die of the plurality of second dies and the first die;
   determining an amount of underfill material to dispose between the first die and the of second die based on the determined distance, using the following equation:

$$\text{Shrinkage Volume}(SV) = ([A \times B \times H \times (1-D)] + \{[C^2 - (\pi \times C^2)/4] \times 2(A+B)\}) \times E;$$

wherein A is a width of the second die, B is a length of the second die, C is a desired width of a fillet of the underfill material proximate a perimeter of the second die, D is a bump density of the second die, E is a shrinkage rate of the underfill material, and H is the distance determined between the second die and the first die; and
   disposing the determined amount of the underfill material under the second die.

2. The method according to claim 1, wherein determining the distance between the second die and the first die comprises measuring a distance between a top surface of the second die and a top surface of the first die, and subtracting a thickness of the second die.

3. The method according to claim 1, wherein disposing the determined amount of the underfill material comprises dispensing the underfill material along one side or two or more sides of the second die.

4. The method according to claim 3, wherein dispensing the underfill material comprises using a dispensing needle.

5. The method according to claim 1, wherein the first die comprises a three dimensional integrated circuit (3DIC) interposer or an interposer that includes a substrate with a plurality of through substrate vias (TSVs) formed therein.

6. The method according to claim 1, wherein the first die includes a redistribution layer (RDL) proximate the top surface of the first die, wherein a plurality of bumps is disposed over portions of the RDL of the first die, and wherein coupling the plurality of second dies to the top surface of the first die comprises attaching the plurality of second dies to the plurality of bumps of the first die.

7. The method according to claim 1, wherein the plurality of second dies further comprises a third die, wherein a width of a gap between the second die and the third die is smaller than the desired width of the fillet of the underfill material, and further comprising:
adjusting a total amount of the underfill material to dispose between the first die and the plurality of second dies based on the width of the gap.

8. The method according to claim 7, wherein the total amount of the underfill material before the adjustment comprises a first volume of fillet disposed along the gap, and wherein the adjusting the total amount of the underfill material comprises:
calculating a second volume of the underfill material in the gap;
subtracting the first volume from the total amount of the underfill material; and
adding the second volume to the total amount of the underfill material.

9. A method of determining an amount of underfill material to dispose between a first die and a plurality of second dies of a three dimensional integrated circuit (3DIC), the first die being coupled to the plurality of second dies, the method comprising:
calculating a volume (V) of the underfill material for a second die of the plurality of second dies using the following equation:

$$V=V1+V2;$$

wherein $V1=[A \times B \times H \times (1-D)]$ is a calculated volume of the underfill material under the second die, wherein $V2=\{[C^2-(\pi \times C^2)/4] \times 2(A+B)\}$ is a calculated volume of a fillet of the underfill material proximate a perimeter of the second die, and wherein A is a width of the second die, B is a length of the second die, C is a desired width of the fillet, D is a bump density of the second die, and H is a distance between the second die and the first die.

10. The method according to claim 9, wherein the calculating the volume (V) of the underfill material for the second die further comprises:
determining a shrinkage rate of the underfill material; and
calculating a shrinkage volume based on the shrinkage rate.

11. The method according to claim 10, wherein calculating the shrinkage volume (SV) further comprises using the following equation:

$$SV=V \times E;$$

wherein V is the calculated volume using equations in claim 9, and wherein E is the shrinkage rate of the underfill material.

12. The method according to claim 9, wherein a gap between at least two of the plurality of second dies is less than the desired width of the fillet of the underfill material, and wherein the calculating the volume (V) further comprises:
calculating a volume of the underfill material in the gap between the at least two of the plurality of second dies using the following equation:

$$VG=Z \times A \times X \times N;$$

wherein Z is a die-to-die dimension between the at least two of the plurality of second dies, A is a width of a side of each of the plurality of second dies, X is a stand-off height of each of the plurality of second dies, and N is the number of gaps between the at least two of the plurality of second dies; and
calculating a total volume of the underfill material between the first die and the plurality of second dies based on the volume VG and the volume V calculated using the equation in claim 9.

13. The method according to claim 12, wherein the calculating the total volume of the underfill material comprises:
adding the volume VG with a plurality of volumes V for all of the plurality of second dies to calculate the total volume, wherein each of the plurality of volumes V is calculated using equations in claim 8; and
modifying the calculated total volume by subtracting from the calculated total volume a portion of the volume V2 corresponding to a volume of fillet disposed along the gap.

14. A method of packaging semiconductor devices, the method comprising:
coupling a plurality of second dies to a top surface of a first die using a plurality of electrical connectors between the respective second dies and the top surface of the first die;
determining a distance between at least one of the plurality of second dies and the first die;
determining an amount of underfill material (V) to dispose between the first die and the plurality of second dies based on the determined distance and a desired width of a fillet of the underfill material using the following equation:

$$V=(V1+V2+VG) \times E;$$

wherein V1 comprises a volume of the underfill material under the plurality of second dies, V2 comprises a volume of the fillet proximate perimeters of the plurality of second dies, VG comprises a volume of the underfill material in one or more gaps between the plurality of second dies, and E is a shrinkage factor of the underfill material; and
disposing the determined amount of the underfill material under the plurality of second dies.

15. The method of claim 14, wherein the determined amount of the underfill material is further based upon a calculation of volume occupied by the plurality of electrical connectors between the respective second dies and the top surface of the first die.

16. The method of claim 14, wherein the distance between at least one of the plurality of second dies and the first die is a stand-off height, and wherein the stand-off height is equal to a thickness of one of the plurality of electrical connector.

17. The method of claim 14, further comprising curing the underfill material.

18. The method of claim 14, wherein VG is zero when one or more widths of the one or more gaps is larger than the desired width of the fillet.

19. The method of claim 14, wherein VG is a non-zero volume of the underfill material in the one or more gaps when a width of the one or more gaps is smaller than the desired width of the fillet.

20. The method of claim 19, wherein when VG is no-zero, V2 is adjusted to exclude volumes of fillet disposed along the one or more gaps with the width smaller than the desired width of the fillet.

* * * * *